United States Patent [19]

Pauza et al.

[11] 3,754,203

[45] Aug. 21, 1973

[54] SUBSTRATE CONNECTOR AND TERMINAL THEREFORE

[75] Inventors: William Vito Pauza; Edward Michael Poltonavage, both of Palmyra, Pa.

[73] Assignee: AMP Incorporated, Harrisburg, Pa.

[22] Filed: July 1, 1971

[21] Appl. No.: 158,778

[52] U.S. Cl. .............. 339/17 CF, 317/101, 339/174, 339/176 MP, 339/192 R, 339/217 R, 339/256 R

[51] Int. Cl. ..... H01r 11/00, H01r 13/50, H05k 1/04

[58] Field of Search ......................... 339/17, 75, 174, 339/176, 252, 92, 192, 256, 217; 174/DIG. 3; 317/101 C, 101 CC, 101 CP, 101 D

[56] References Cited

UNITED STATES PATENTS

| | | | |
|---|---|---|---|
| 3,670,290 | 6/1972 | Angele et al. | 339/75 MP |
| 3,391,382 | 7/1968 | Leibovitz | 339/17 CF X |
| 3,448,345 | 6/1969 | Loehler, Jr. et al. | 339/17 CF X |
| 3,409,861 | 11/1968 | Barnes et al. | 339/17 CF |

FOREIGN PATENTS OR APPLICATIONS

| | | | |
|---|---|---|---|
| 6,409,207 | 2/1966 | Netherlands | 339/17 C |

*Primary Examiner*—Marvin A. Champion
*Assistant Examiner*—Terrell P. Lewis
*Attorney*—William J. Keating, Frederick W. Raring et al.

[57] ABSTRACT

An interconnection system is disclosed for connecting ceramic substrate and the like to printed circuit boards, panels, or the like. The connector has a plurality of terminals therein each including a spring contact near one end for making contact with circuitry on a ceramic substrate, the substrate being snapped or otherwise secured in position on the connector. The other end of each terminal is a solder post and is designed to be plugged into a printed circuit board and soldered to circuitry thereon. In another form the other end of the terminal is in the form of a post to receive a wrapped electrical conductor therearound.

6 Claims, 10 Drawing Figures

SUBSTRATE CONNECTOR AND TERMINAL THEREFORE

BACKGROUND OF THE INVENTION

The invention is for use in the electronics field for connecting integrated circuitry on ceramic substrates or MOS circuitry to printed circuit boards or other external circuitry. In the prior art the practice has been to attach a lead frame comprising a number of leads equal to the number of circuits on the substrate to be terminated. The lead frame is attached by metal joining methods brazing, thermocompression bending, or soldering each lead to its respective circuit pad and then trimming away the excess metal frame structure. Generally the leads are then bent at right angles to facilitate plugging into a header or directly into a printed circuit board or the like. This soldering and trimming operation greatly adds to the manufacturing costs of the integrated circuit package.

OBJECTS OF THE INVENTION

It is one object of the invention to provide an inexpensive connector assembly for terminating MOS circuitry to printed circuit boards or other external circuitry.

It is another object of the invention to provide a connector assembly for terminating MOS circuitry wherein the ceramic substrate may be removably snapped into position on the connector.

It is still a further object of the invention to provide a novel terminal for use in a header wherein the terminal has a spring contact for electrically engaging MOS integrated circuitry.

BRIEF SUMMARY OF THE INVENTION

The above objects of the invention are satisfied by providing a header of dielectric material having parallel rows of passageways extending therethrough. Each passageway is designed to receive an elongated electrical terminal having a general channel shape comprising a bottom wall and two opposed substantially parallel side walls extending therefrom. The bottom wall has struck therefrom a spring contact member which extends between and beyond the two side walls. The contact portion electrically engages a respective circuit pad on the substrate and an extension of one end of the terminal is designed to be terminated to external circuitry such as a printed circuit board, individual wire conductors, or the like.

Other objects and attainments of the present invention will become apparent to those skilled in the art upon a reading of the following detailed description when taken in conjunction with the drawings in which there are shown and described illustrative embodiments of the invention; it is to be understood, however, that these embodiments are not intended to be exhaustive nor limiting of the invention but are given for purposes of illustration in order that others skilled in the art may fully understand the invention and the principles thereof and the manner of applying it in practical use so that they may modify it in various forms, each as may be best suited to the conditions of a particular use.

BRIEF DESCRIPTION OF THE DRAWINGS

FIG. 2 is a section view taken along line 2—2 of FIG. 1 showing terminals secured in the header, the ceramic substrate prior to connection with the header and the printed circuit board to be terminated to;

FIG. 5 is a plan view of one form of an MOS circuitry arrangement;

FIG. 9 is an exploded perspective view of a different embodiment of the invention.

DESCRIPTION OF THE INVENTION

Figure 1:
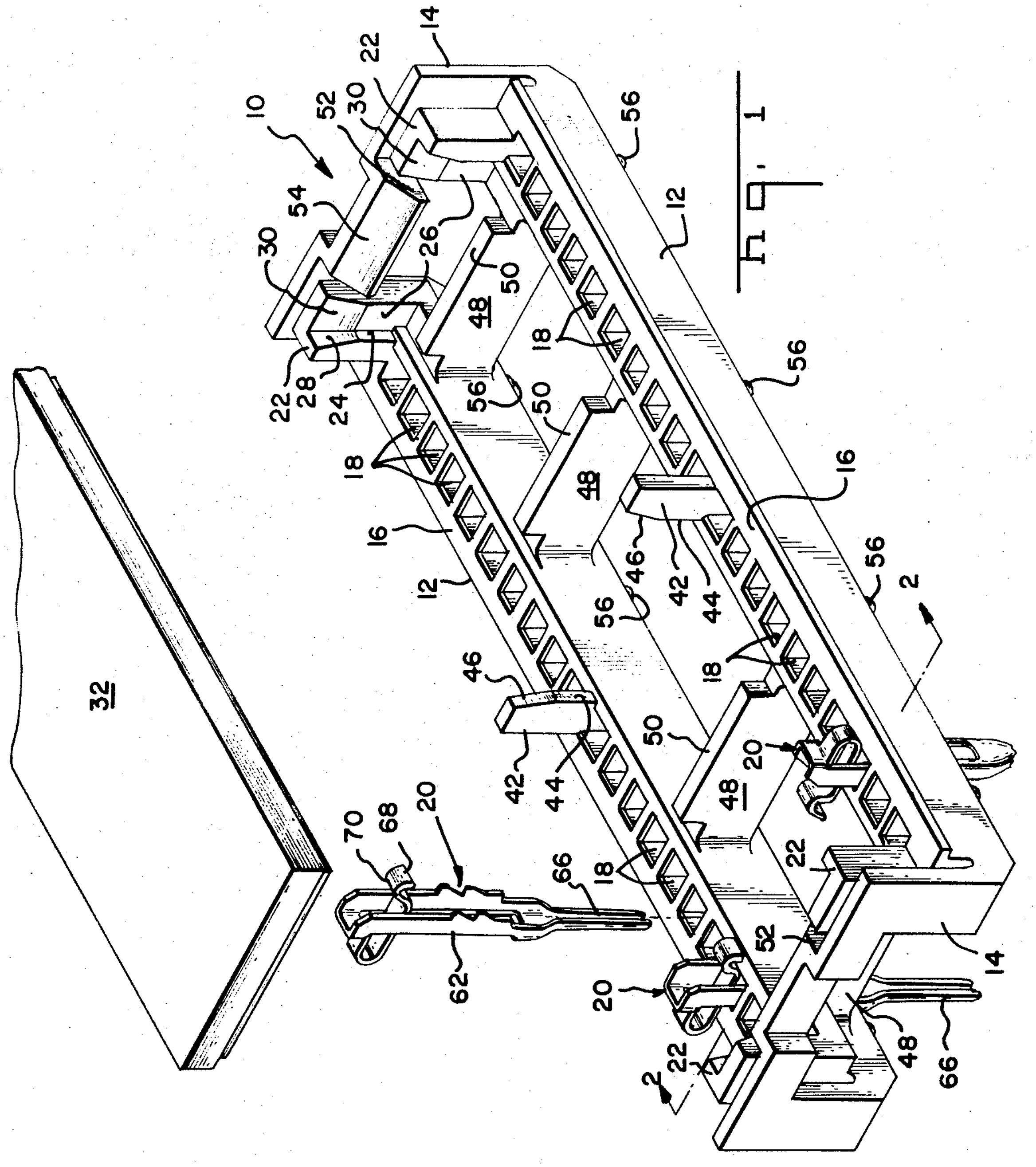
FIG. 1 is a perspective view of a connector employing the teachings of the present invention.
Figure 2:
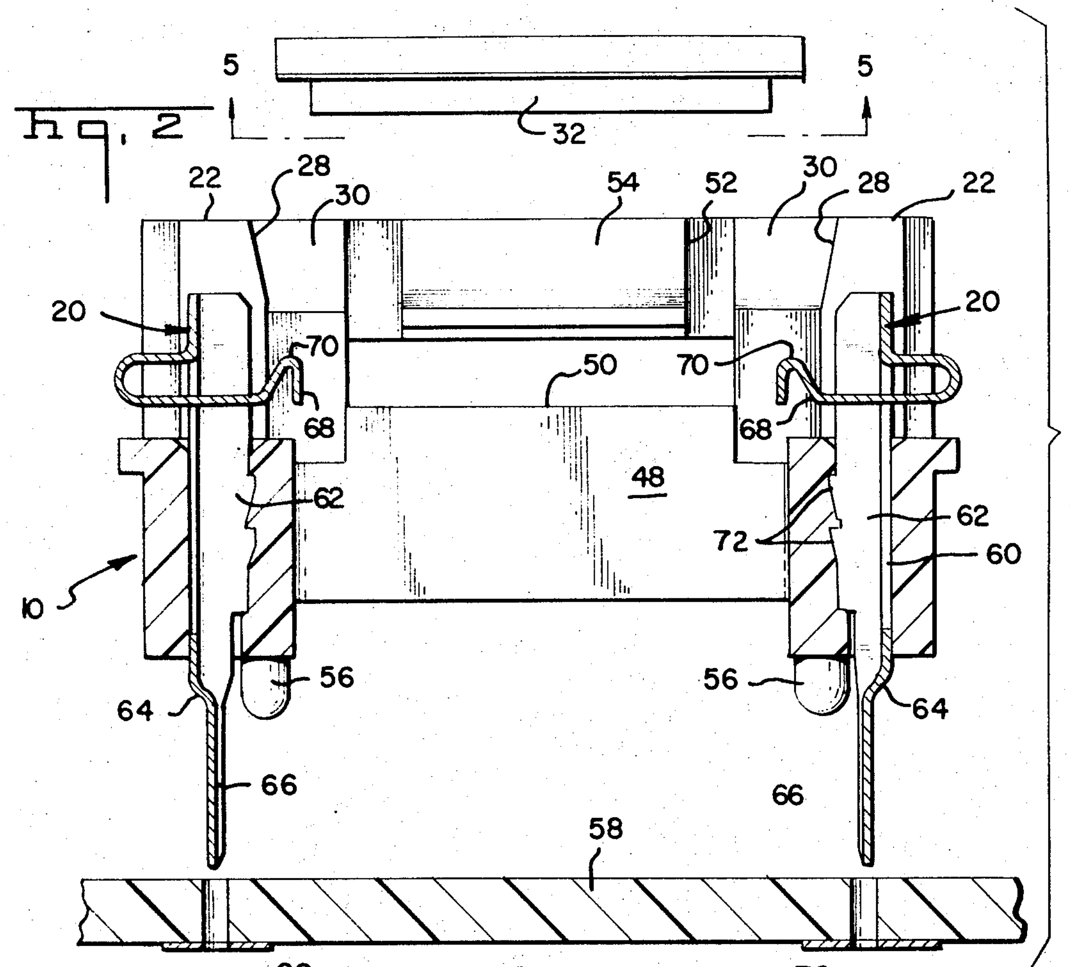

In FIG. 1 there is shown an illustrative embodiment of the invention wherein a header 10 is depicted. The header is of a suitable dielectric material such as Polycarbonate or glass filled nylon. The header 10 has a generally rectangular shape comprising elongated side members 12 and shorter end members 14 which extend above the top face or side 16 of header 10. Each side member has a plurality of passageways 18 therethrough designed to receive therein an electrical terminal 20.

At each end of each side member is a vertically upstanding corner guide 22 each having a side face 24 and an end face 26, respectively, and having beveled lead-in faces or aprons 28, 30. These corner guides accurately locate on the header the ceramic substrate 32.

Substrate 32, as more clearly seen in FIG. 5, is typical of MOS circuitry and has located thereon a forty lead integrated circuit chip 34. The circuitry of the chip is direct or wire bonded, as indicated at 36, to respective leads 38 which terminate as contact pads 40 located at opposite edge surfaces of the substrate. It is, of course, envisioned that variously configured substrates having varied circuitry thereon are included in the inventive concept for use with appropriately configured header and terminal combinations.

Additional guides 42 accurately maintain the opposite edges of substrate 32 in appropriate alignment and include guide faces 44 each having a beveled lead-in 46. Bridging or joining each side member 12 are support members 48 each including a top surface 50 which, as better seen in FIGS. 3 and 4, prevents the substrate from putting undue strain on the terminals 20. Each end member 14 is attached to and integral with each side member 12 in a cantilever fashion. Although both members 14 have been disclosed as being flexibly mounted, in practice only one member 14 need be flexible. Each end member includes a snap catch 52 including a beveled lead-in face 54. As the substrate is forced down against the faces 54 each end member is flexed outwardly until the end edges of the substrate pass by the snap catch 52 which then snaps over the edges to retain the substrate in position as seen in FIG. 4.

Figure 3:
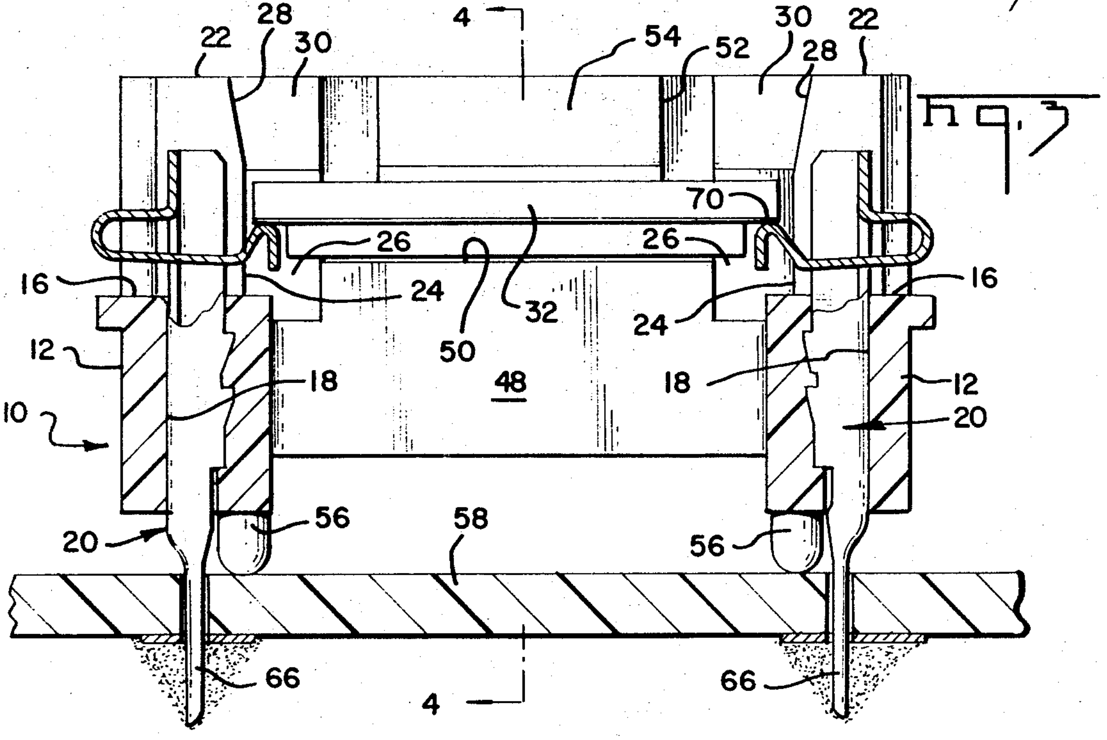
FIG. 3 is a section view similar to FIG. 2 but showing the header with substrate attached and terminals terminated to a printed circuit board.
Figures 3, 4:
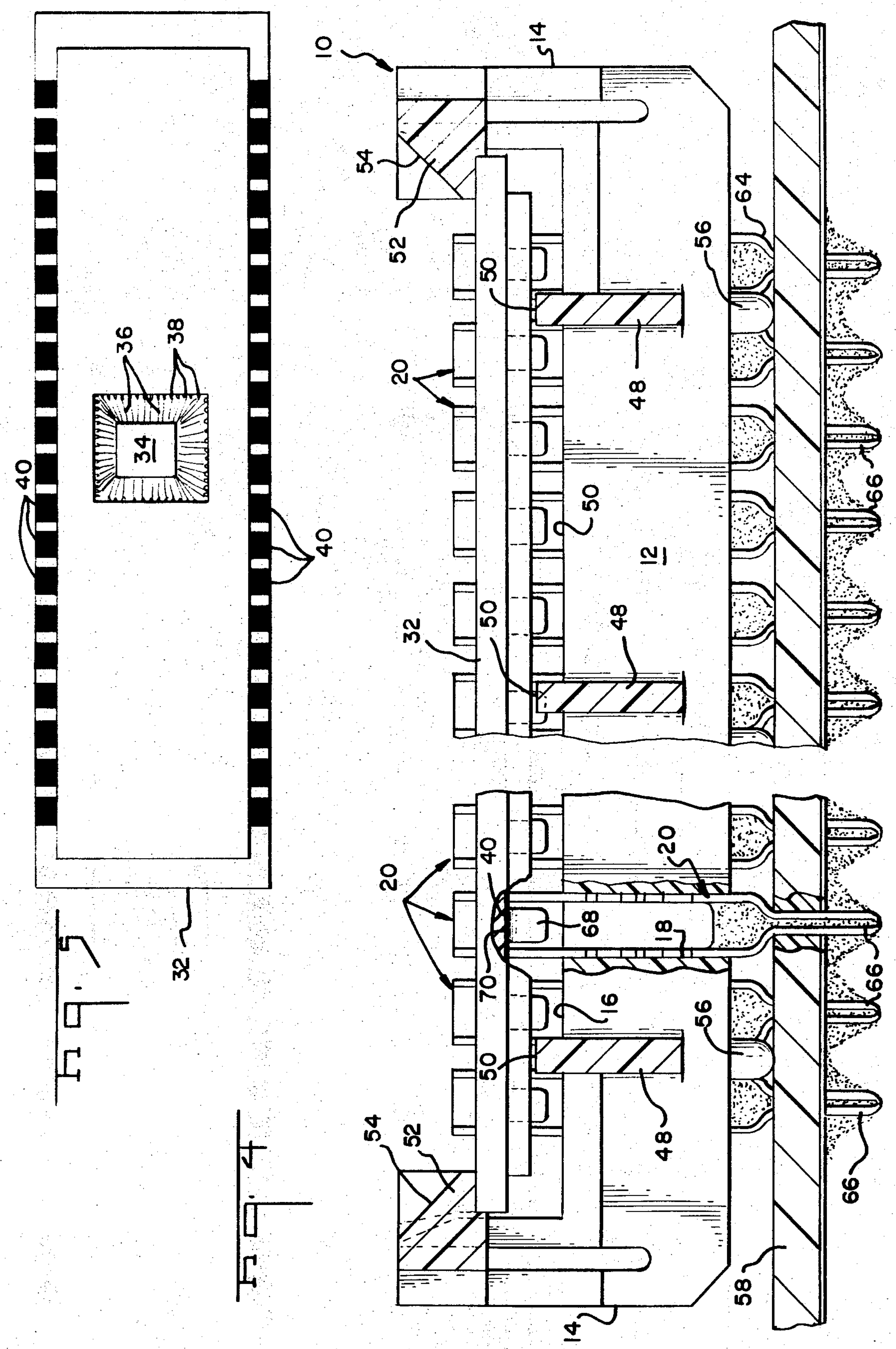
FIG. 4 is a sectional view along line 4—4 of FIG. 3 and partially fragmentary showing the substrate secured to the header and terminal with terminals plugged into a printed circuit board and soldered to circuitry thereon.

Positioned along the underside of each side member 12 are standoffs 56 which, as seen more clearly in FIGS. 3 and 4, function to maintain clearance between the header 10 and printed circuit board 58, which receives the terminals 20.

Figures 6, 7, 8:
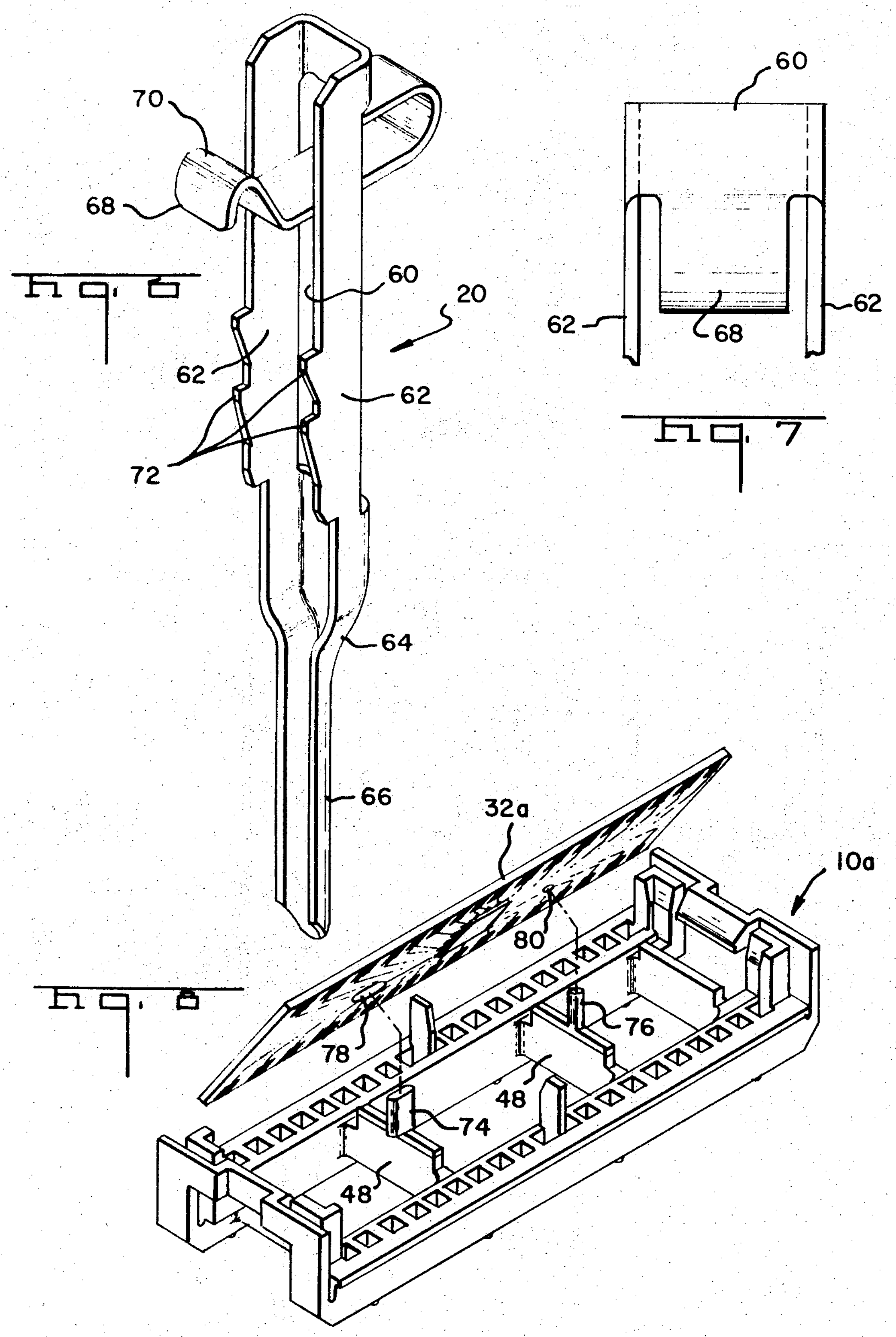
FIG. 6 is a perspective view of a terminal employing the teachings of the present invention.
FIG. 7 is a partial plan view of the upper portion of the terminal taken along line 7—7 of FIG. 6.
FIG. 8 is a perspective view showing modified forms of a header and ceramic substrate.

FIG. 6 illustrates the terminal 20 used in conjunction with header 10 and substrate 32. Terminal 20 is of an elongate generally channel shaped configuration having a bottom wall 60 and opposing side walls 62 extending generally normally therefrom. The channel shape of the terminal narrows down as at 64 into a solder post 66. It should be noted that solder post 66 could be adapted for receiving the end of a wire conductor wrapped therearound or adapted for other modes of termination techniques consistent with the invention. At the opposite end of the terminal 20 from post 66 is a spring contact finger 68 including a contact face or area 70 for making electrical contact with a respective contact pad 40 located on substrate 32. This spring contact finger is formed out of the bottom wall 60 and with the reversely bent configuration shown the desired spring characteristics are achieved. Located on the outer edges of walls 62 are serrations or teeth 72 the purpose of which is to provide a friction fit for the terminal 20 when it is inserted into its respective passageway 18. After insertion the serrations or teeth will resist expulsion of the terminals such as when plugging the header with terminals into circuit board 58.

FIG. 8 shows a slightly modified header 10*a* having the provision for orienting a substrate. For this purpose posts 74 and 76, being respectively, oblong and cylindrical, are integral with two support members 48. A substrate 32*a* to be used with a header 10*a* is suitably configured with recesses or holes 78, 80 respectively. In other details the header 10*a* is identical with header 10.

Figures 7, 10:
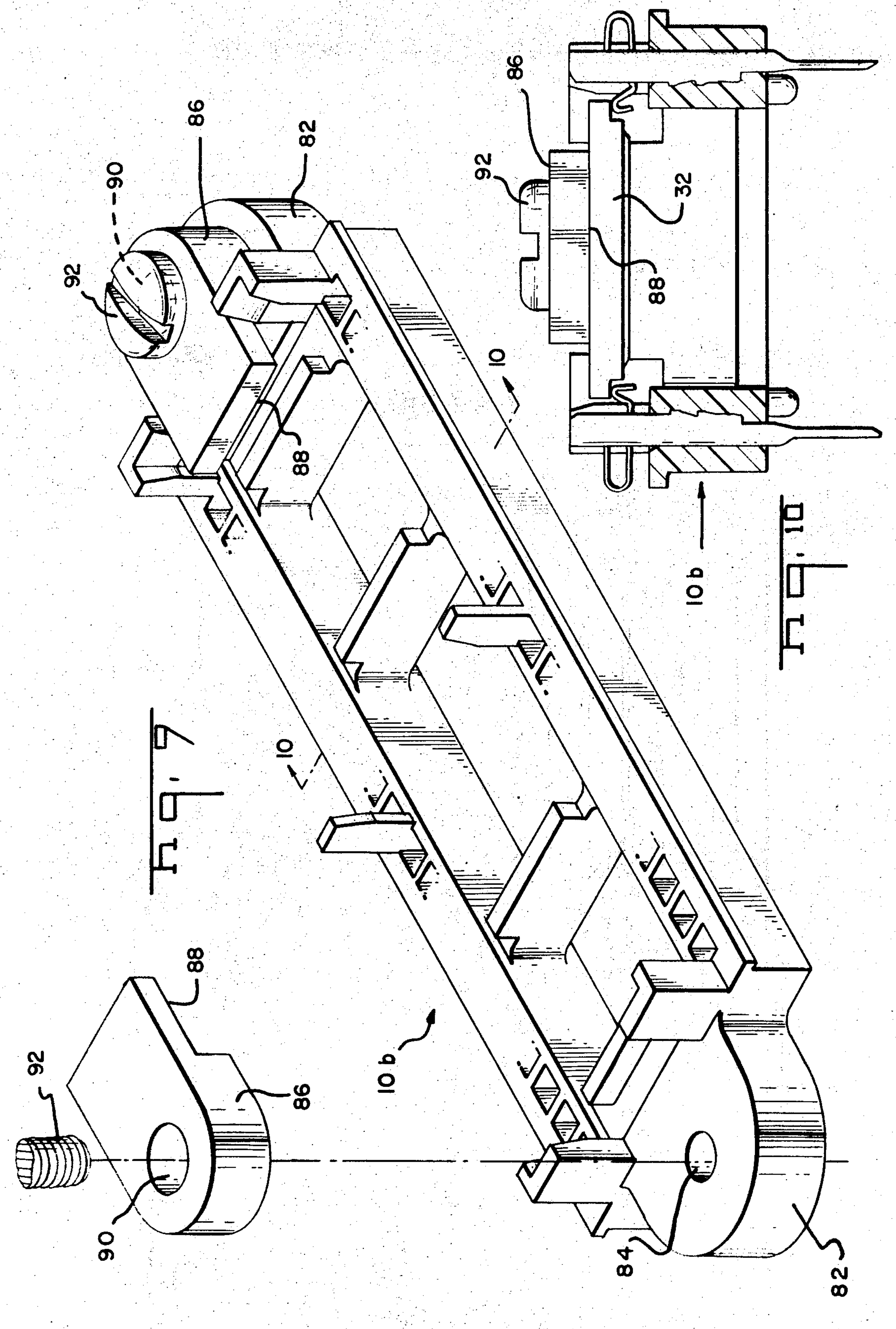
FIG. 10 is a section view taken along line 10—10 of FIG. 9.

FIGS. 9 and 10 depict a header 10*b* wherein like members indicate like parts with header 10. Header 10*b* in place of the end members 14 of header 10, has end members 82 each of which comprise a block having holes 84 therein. Locking blocks 86 including lips 88 and holes 90 which align with respective holes 84 are designed to cooperate with end members 82 to secure the substrate 32 in place. Securing is accomplished by screw 92 or any other suitable means and contact pressure on the terminal contact fingers may be adjustable.

It will, therefore, be appreciated that the aforementioned and other desirable objects have been achieved; however, it should be emphasized that the particular embodiments of the invention, which are shown and described herein, are intended as merely illustrative and not as restrictive of the invention.

We claim:

1. In combination with a panel-like member such as a substrate having circuit means on one face thereof and having conductors extending from said circuit means to the edges of said panel-like member, an electrical connector comprising:

an insulating housing having a central substrate-receiving area on one side thereof, said panel-like member being in said receiving area with the plane of said panel-like member extending parallel to said one side, a plurality of contact-receiving cavities extending through said housing from said one side thereof to the other side thereof, said cavities being disposed in at least partially surrounding relationship to said central receiving area, an electrical contact terminal in each of said cavities, each of said terminals having one end which is proximate to said one side of said housing and a second end which is proximate to said other side, contact means integral with said one end of each of said terminals, each of said contact means comprising cantilever arm means extending laterally between said panel-like member and said one side of said housing and inwardly of said housing into said receiving area, each of said arm means having a free end in engagement with one of said conductors on said one face, and holding means on said housing functioning to hold said panel-like member against said free ends of said arms means whereby said arm means are resiliently flexed and are maintained in electrical contact with said conductors on said panel-like member.

2. In combination with a panel-like member such as a rectangular substrate having circuit means on one face thereof and having conductors extending to two opposite edges of said face, said conductors having terminal pads at spaced-apart locations on said one side adjacent to said opposite edges, an electrical connector comprising:

an insulating housing comprising a generally rectangular open frame having a central substrate-receiving area on one side thereof, said substrate being in said receiving area with said one face opposed to said one side, said frame comprising parallel side rails extending beside said opposite edges of said substrate, a plurality of contact receiving cavities in said side rails, each of said cavities having an electrical contact terminal therein, each of said terminals having one end which is proximate to said one side of said housing and a second end which is proximate to the other side of said housing, each of said terminals having a contact arm integral therewith at said one end, each of said contact arms extending cantilever fashion inwardly of said open frame between said one face of said substrate and said one side of said housing, each of said contact arms having a free end in engagement with one of said terminal pads on said one face, and holding means functioning to hold said panel-like member against said free ends of said arms whereby, said arms are resiliently flexed and maintained in electrical contact with said terminal pads.

3. A connector and a substrate as set forth in claim 1, each of said terminals having a generally channel-shaped intermediate portion comprising a web and sidewalls, each of said contact arms being struck from said web and being integral with said web adjacent to said one end.

4. A connector and a substrate as set forth in claim 3 wherein each of said arms extends from said one end of its respective web portion laterally outwardly from said housing, is reversely bent and extends between said side-walls towards said substrate receiving area.

5. A connector and a substrate as set forth in claim 2 wherein said holding means comprises clamping plates secured to said housing between said side rails, said clamping plates extending inwardly of said housing and partially over said one panel-like member.

6. A connector and a substrate as set forth in claim 2 including substrate support surfaces on said one side of said housing, said support surfaces extending between said side rails.

* * * * *